United States Patent
Yim et al.

(10) Patent No.: US 11,354,464 B2
(45) Date of Patent: Jun. 7, 2022

(54) SELECTIVE SIMULATION OF VIRTUALIZED HARDWARE INPUTS

(71) Applicant: Google LLC, Mountain View, CA (US)

(72) Inventors: Keun Soo Yim, San Jose, CA (US); Iliyan Malchev, San Francisco, CA (US)

(73) Assignee: GOOGLE LLC, Mountain View, CA (US)

(*) Notice: Subject to any disclaimer, the term of this patent is extended or adjusted under 35 U.S.C. 154(b) by 0 days.

(21) Appl. No.: 16/913,412

(22) Filed: Jun. 26, 2020

(65) Prior Publication Data

US 2020/0327266 A1 Oct. 15, 2020

Related U.S. Application Data

(63) Continuation of application No. 16/394,069, filed on Apr. 25, 2019, now Pat. No. 10,740,511, which is a continuation of application No. 15/277,036, filed on Sep. 27, 2016, now Pat. No. 10,303,820.

(51) Int. Cl.
*G06F 30/20* (2020.01)
*G06F 9/455* (2018.01)
*G06F 9/451* (2018.01)

(52) U.S. Cl.
CPC .............. *G06F 30/20* (2020.01); *G06F 9/452* (2018.02); *G06F 9/45533* (2013.01); *G06F 9/45558* (2013.01); *G06F 2009/45579* (2013.01)

(58) Field of Classification Search
CPC .......... G06F 30/20; G06F 2009/45579; G06F 9/452; G06F 9/45533; G06F 9/45558
See application file for complete search history.

(56) References Cited

U.S. PATENT DOCUMENTS

| | | |
|---|---|---|
| 8,533,531 B2 | 9/2013 | El Mahdy et al. |
| 8,572,178 B1 | 10/2013 | Frazzini et al. |
| 8,806,054 B1 | 8/2014 | Overton et al. |
| 8,934,887 B2 | 1/2015 | Dgani et al. |

(Continued)

OTHER PUBLICATIONS

European Patent Office; Communication Pursuant to Article 94(3) EPC issued in Application No. 16781246.0; 7 pages; dated Mar. 18, 2021.

(Continued)

*Primary Examiner* — Tuan C Dao
(74) *Attorney, Agent, or Firm* — Middleton Reutlinger

(57) ABSTRACT

Methods and apparatus are described herein emulating, by one or more servers on behalf of a mobile computing device, a cloud-based virtual machine. The cloud-based virtual machine may include a virtualized hardware component that provides, as virtual hardware input for a software application executing on the cloud-based virtual machine, either "genuine" virtual hardware input or "simulated" virtual hardware input. Genuine virtual hardware input may be based on an actual hardware signal received from a hardware component of the mobile computing device that corresponds to the virtualized hardware component. Simulated virtual hardware input may be generated independently of any hardware signal associated with the hardware component. Output of the software application may be interactively streamed to the mobile computing device.

15 Claims, 5 Drawing Sheets

(56) References Cited

U.S. PATENT DOCUMENTS

| | | | |
|---|---|---|---|
| 9,390,268 B1* | 7/2016 | Martini | H04L 63/1433 |
| 9,645,910 B1 | 5/2017 | Kaila et al. | |
| 9,842,139 B1* | 12/2017 | Cohen | G06F 16/2465 |
| 2004/0150372 A1* | 8/2004 | Lee | H02J 7/0031 |
| | | | 320/148 |
| 2008/0005320 A1 | 1/2008 | Chen | |
| 2008/0288878 A1 | 11/2008 | Hayashi et al. | |
| 2009/0243914 A1 | 10/2009 | Song et al. | |
| 2011/0127831 A1 | 6/2011 | Skarani et al. | |
| 2013/0187930 A1 | 7/2013 | Millman | |
| 2013/0232485 A1 | 9/2013 | Murray | |
| 2014/0278847 A1 | 9/2014 | Gallo | |
| 2014/0364209 A1* | 12/2014 | Perry | A63F 13/12 |
| | | | 463/31 |
| 2015/0048976 A1 | 2/2015 | Petersen | |
| 2015/0070351 A1 | 3/2015 | Tarquini et al. | |
| 2015/0228153 A1* | 8/2015 | Hedrick | G06Q 20/3223 |
| | | | 463/25 |
| 2015/0289110 A1* | 10/2015 | Kilpatrick, II | H04W 4/029 |
| | | | 455/456.1 |
| 2015/0302730 A1* | 10/2015 | Geerlings | G08C 17/02 |
| | | | 340/5.25 |
| 2015/0336005 A1* | 11/2015 | Melnick | A63F 13/34 |
| | | | 463/29 |
| 2015/0356501 A1 | 12/2015 | Gorjestani et al. | |
| 2016/0070365 A1 | 3/2016 | Patwardhan et al. | |
| 2016/0287989 A1* | 10/2016 | Fung | A63F 13/816 |
| 2017/0127292 A1* | 5/2017 | Jones | H04W 4/021 |
| 2017/0140120 A1 | 5/2017 | Thrower | |
| 2017/0195863 A1 | 7/2017 | Demele et al. | |

OTHER PUBLICATIONS

Estevez et al. (Apr. 2014). "Geo-location-aware emulations for performance evaluation of mobile applications." In Wireless On-demand Network Systems and Services (WONS), 2014 11th Annual Conference on (pp. 73-76). IEEE. 2014.

Genymotion, User Guide Version 2.7.2, Jun. 14, 2016, 60 pages. 2016.

Anonymous: "Test Drive Begins Beta Rollout on Android Phones—Amazon Mobile App Distribution Blog", (Sep. 3, 2015), XP055321966, Retrieved from Internet: URL:http://web.archive.org/web/20150903073350/https://developer.amazon.com/public/community/post/Tx2TL2FYHG5KWIX/Test-Drive-Begins-Beta-Rollout-on-Android-Phones.html [retrieved on Nov. 23, 2016] p. 1-p. 2. May 21, 2012.

Shi et al: "SHARC: A Scalable 3D Graphics Virtual Appliance Delivery Framework in Cloud." Journal of Network and Computer Applications 34.4 (2011): pp. 1078-1087. 2011.

Lai et al. "A Service Based Lightweight Desktop Virtualization System" 2010 International Conference on Service Sciences. IEEE, 2010, 6 pages. 2010.

International Search Report and Written Opinion of PCT Serial No. PCT/US16/054000 dated Dec. 2, 2016.

* cited by examiner

SELECTIVE SIMULATION OF VIRTUALIZED HARDWARE INPUTS

BACKGROUND

Some application services provide the ability to interactively "stream" mobile software applications (more simply "applications" or "apps") to mobile devices such as smart phones, tablet computers, vehicle computing systems, wearable devices (e.g., smart watches), etc. This allows a user to operate the application, e.g., for a trial period, without actually installing the application locally on the mobile device. In some instances, application streaming may be accomplished by installing the application on a virtual machine operated by one or more servers (e.g., collectively forming a so-called "cloud"). One or more input/output ("I/O") streams may be established between the virtual machine and the mobile device. The one or more I/O streams may provide various modalities of input data received at the mobile device to the virtual machine, and likewise may provide various modalities of output data generated by the application from the virtual machine to the mobile device.

Some applications may depend on input provided by hardware components (or provided by device drivers associated therewith) that are relatively unique to mobile devices, such as position coordinate sensors (e.g., global positioning system, or "GPS"), cellular communication interfaces, accelerometers (e.g., to control gameplay), cameras, and so forth. However, for a variety of reasons these signals may be unavailable and/or incompatible with the software application. For example, a camera may be disabled due to insufficient battery level, a fingerprint sensor may be unavailable because of damage to the sensor, a user may disable GPS functionality on his or her phone for privacy reasons, or a user may be located in a geographic location that fails to satisfy one or more geographic criteria imposed by the application. Additionally or alternatively, and again for a variety of reasons, users may wish to alter or otherwise replace signals provided by hardware components of their mobile devices.

SUMMARY

The present disclosure is generally directed to methods, apparatus and computer-readable media (transitory and non-transitory) for emulating a virtualized hardware component that provides, as virtual hardware input for a software application executing on a cloud-based virtual machine, either "genuine" virtual hardware input or "simulated" virtual hardware input. In various implementations, "genuine" virtual hardware input may be based on actual hardware input received from a hardware component of the remote mobile device that corresponds to the virtualized hardware component. For example, genuine virtual hardware input may replicate (e.g., be passed through) actual hardware input, or at the very least may be derived from the actual hardware input. By contrast, "simulated" virtual hardware input may be generated independently of hardware input associated with the hardware component. Examples of how simulated virtual hardware input may be generated are discussed in more detail below.

In some implementations, the selection between the genuine or simulated virtual hardware input may be performed by a user, e.g., during execution of the software by the cloud-based virtual machine. In other implementations, the selection may be performed automatically, e.g., by the mobile device, by the cloud-based virtual machine, by the application executed by the cloud-based virtual machine, or by another component (e.g., a virtual machine monitor, or "VMM," operating on the cloud).

In implementations in which selection between genuine and simulated virtual hardware input is performed automatically, the selection may be performed based on or otherwise in response to various signals and/or events. In some implementations, the selection may be performed based on one or more attributes of the mobile device. Suppose the application executed by the cloud-based virtual machine requires a GPS signal, and the mobile device lacks a GPS signal, either because the user has disabled it or because the mobile device cannot otherwise obtain GPS coordinates. In various implementations, simulated GPS virtual hardware input may be provided to the application, e.g., by a virtualized GPS component emulated by the cloud-based virtual machine. So far as the application is concerned, the GPS input appears to be actual hardware input, and so the application may perform normally.

In some implementations, the simulated GPS virtual hardware input may be selected at random, so that the purported GPS location of the mobile device is a randomly-selected location. In other implementations, the simulated GPS hardware input may be specified by a user of the mobile device. In yet other implementations, the simulated GPS hardware input may be generated based on one or more other signals available to the cloud-based virtual machine.

Suppose the mobile device has a cellular card installed and is in communication with the one or more servers that host the cloud-based virtual machine using one or more cellular communication channels. The cloud-based virtual machine may obtain actual cellular hardware input from the cellular card installed on the mobile device. The cloud-based virtual machine may then emulate its own virtualized cellular card that provides a simulated cellular hardware input. The simulated cellular hardware input may be used, e.g., by a virtualized GPS component emulated by the cloud-based virtual machine, to generate simulated GPS virtual hardware input that includes at least an approximate location of the mobile device derived from the actual cellular hardware input (e.g., a location of one or more radio cell towers to which the mobile device is connected). This simulated GPS virtual hardware input may be provided to the application executed by the cloud-based virtual machine. Again, the application may be unaware that the virtual hardware input is anything but actual GPS hardware input. Other attributes of the mobile device that may trigger and/or be used for selection between genuine and simulated virtual hardware input are described below.

In some implementations, a computer implemented method may be provided that includes the following operations: operating, by one or more servers, a virtual machine to emulate a mobile device; executing, by the virtual machine, a software application; interactively streaming, by the virtual machine, output of the software application to a remote mobile device in communication with the one or more servers over one or more communication networks, wherein a user of the given remote mobile device interacts with the given software application using one or more hardware components of the remote mobile device; and providing, by a virtualized hardware component emulated by the virtual machine, virtual hardware input for the software application, wherein the providing includes selecting, as the virtual hardware input, either: genuine virtual hardware input that is based on an actual hardware signal received from a hardware component of the remote mobile device that corresponds to the virtualized hardware component; or simulated virtual hardware input that is generated independently of any hardware signal associated with the hardware component.

This method and other implementations of technology disclosed herein may each optionally include one or more of the following features.

In various implementations, the selecting may be performed automatically based on availability of the actual hardware signal from the hardware component of the remote mobile device. In various implementations, the selecting may be performed automatically based on one or more attributes of the remote mobile device. In various implementations, the one or more attributes of the remote mobile device may include battery power of the remote mobile device. In various implementations, the one or more attributes of the remote mobile device may include one or more attributes of a wireless signal used by the remote mobile device.

In various implementations, the selecting may be performed automatically based on a comparison of the actual hardware signal to one or more criteria. In various implementations, at least one of the one or more criteria may be imposed by the software application. In various implementations, the simulated hardware input may be randomly generated. In various implementations, the simulated hardware input may be generated based at least in part on another actual hardware signal from another hardware component of the remote mobile device. In various implementations, the virtualized hardware component may include a position coordinate sensor, and the another hardware component of the remote mobile device comprises a cellular communication component. In various implementations, the selecting may be performed by a virtual machine monitor operated by one or more of the servers.

Other implementations may include a non-transitory computer readable storage medium storing instructions executable by a processor to perform a method such as one or more of the methods described above. Yet another implementation may include a system including memory and one or more processors operable to execute instructions, stored in the memory, to perform a method such as one or more of the methods described above. A further implementation provides a computer program comprising instructions that when executed by computing apparatus control it to perform any of the methods described above.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

DETAILED DESCRIPTION

Figure 1:
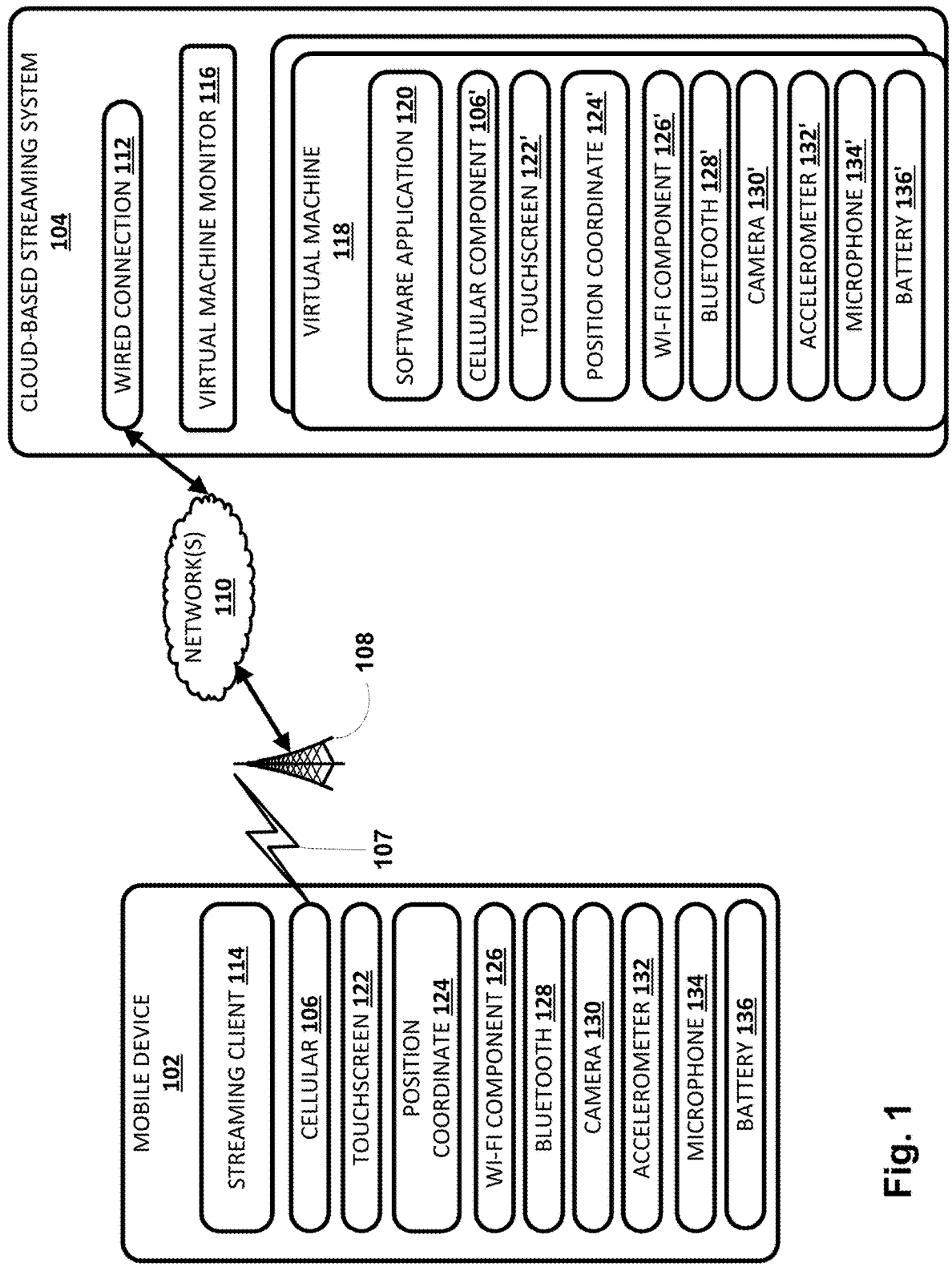
FIG. 1 illustrates an example environment in which disclosed techniques may be practiced, in accordance with various implementations.

FIG. 1 illustrates an example environment in which a virtualized hardware component may be emulated to provide, as virtual hardware input for a software application executing on a cloud-based virtual machine, either "genuine" virtual hardware input or "simulated" virtual hardware input. The example environment includes a mobile device 102 and cloud-based streaming system 104. Cloud-based streaming system 104 is so-named because it may be implemented by one or more computers (e.g., servers) that communicate, for example, through a network (not depicted), and hence form what is commonly known as a "cloud." Cloud-based streaming system 104 may be an example of a system in which the systems, components, and techniques described herein may be implemented and/or with which systems, components, and techniques described herein may interface. While only a single mobile device 102 is depicted in FIG. 1, this is not meant to be limiting. Any number of mobile devices 102, such a multiple mobile devices associated with (e.g., owned by) a user to form an "ecosystem" of mobile devices, may interact with cloud-based streaming service 104 to interactively stream one or more software applications.

Mobile device 102 may be a computer in communication with cloud-based streaming system 104 through a network such as a local area network (LAN) or wide area network (WAN) such as the Internet (one or more such networks indicated generally at 110). Mobile device 102 may be, for example, a tablet computing device, a mobile phone computing device, a computing device of a vehicle of the user (e.g., an in-vehicle communications system, an in-vehicle entertainment system, an in-vehicle navigation system), a wearable apparatus of the user that includes a computing device (e.g., a watch of the user having a computing device, glasses of the user having a computing device, a wearable music player), and so forth. Additional and/or alternative mobile devices may be provided.

In some implementations, mobile device 102 and cloud-based streaming system 104 each include memory for storage of data and software applications, a processor for accessing data and executing applications, and components that facilitate communication over network 110. The operations performed by mobile device 102 and/or cloud-based streaming system 104 may be distributed across multiple computer systems. Cloud-based streaming system 104 may be implemented as, for example, computer programs running on one or more computers in one or more locations that are coupled to each other through a network.

In the example of FIG. 1, mobile device 102 includes a cellular component 106 (e.g., a cellular hardware card or chip) that it uses to establish a wireless (e.g., cellular) data connection 107 with a radio tower 108. Radio tower 108 may provide what is referred to as a "cell" that may be joined by multiple mobile devices in wireless range of radio tower 108. Mobile device 102 may be "handed off" to another radio tower when mobile device 102 is carried out of range of radio tower 108, e.g., so that mobile device 102 maintains seamless network connectivity. Radio tower 108 may be in communication with cloud-based streaming system 108 via one or more networks 110. For example, one or more servers of cloud-based streaming system 104 may include a wired connection 112 (e.g., T1, Ethernet, etc.) to one or more networks 110. Hence, radio tower 108 may be a gateway through which mobile device 102 accesses various network resources, such as the Internet.

In various implementations, cellular component 106 and/or radio tower may employ a variety of communication technologies, protocols, and/or standards to communicate with each other wirelessly. These may include, among others, 3GPP Long Term Evolution ("LTE"), General Packet Radio Service ("GPRS"), Evolution Data Optimized ("Ev-DO"), Evolved High Speed Packet Access ("HSPA+"), Dual-Carrier HSDPA, Global System for Mobile Communications ("GSM"), Code Division Multiple Access ("CDMA"), Time Division Multiple Access ("TDMA"), Digital Enhanced Cordless Telecommunications ("DECT"), derivatives thereof, as well as any other wireless protocols that are designated as 3G, 4G, 5G, and so forth.

As noted in the background, rather than installing software applications locally on mobile device 102, in some scenarios, software applications may be executed remotely from mobile device 102 and interactively streamed to mobile device 102. A user (not depicted) of mobile device 102 may have the same experience as if the software application were installed locally, and yet much of the processing occurs remotely from mobile device 102. In the example of FIG. 1, this interactive software application streaming may be implemented by executing a streaming client 114 on mobile device 102, which will be discussed in more detail below.

In various implementations, cloud-based streaming service 104 may include a virtual machine monitor ("VMM") 116 that is configured to invoke, initiate, or otherwise create one or more cloud-based virtual machines 118 (hereinafter, "virtual machines"). In various implementations, each virtual machine 118 may be configured to operate a software application 120 that is to be interactively streamed to mobile device 102. More particularly, software application 120 may interactively stream various types of output data (e.g., graphical output such as graphical user interfaces, audio output, haptic feedback, etc.) to streaming client 114, which streaming client 114 may then render using applicable output hardware components of mobile device 102. Likewise, streaming client 114 may interactively stream various types of input to software application 120 executed by virtual machine 118. In this manner, a user of mobile device 102 may interact with software application 120 as though it were installed locally on mobile device 102. In particular, a user of mobile device 102 may interact with software application 120 using one or more hardware components of the mobile device 102.

In some implementations, virtual machine 118 may be configured to emulate a mobile device, e.g., the same environment (e.g., operating system) provided by mobile device 102, or a similar, compatible, and/or generic environment. For example, virtual machine 118 may operate the same version of an operating system executed by mobile device 102, or may operate the same operating system but a different version (e.g., an older more stable version, or a newer version that is compatible with various software applications). More generally, as used herein, "emulate" is not limited to replicating all hardware and software components of a computing device and/or particular hardware component. Rather, emulation may refer to simulating at least some components of a device and/or hardware component, and/or simulating compatible components of the device and/or hardware component. For example, emulating a mobile device may include emulating only those components of the mobile device necessary for operation of a particular software application. These components may include, for instance, an operating system (e.g., an operating system kernel), one or more device drivers, and so forth. In addition to emulating mobile devices, in other implementations, virtual machine 118 may emulate other environments as well, such as traditional computing devices such as desktop computers, laptop computers, servers, and so forth.

Software application 120 may take various forms. In some implementations, any software application capable of being installed locally on mobile device 102 may be executed "virtually" by virtual machine 118. Accordingly, software application 120 may take the form of a game (including location-based "augmented reality" games), a messaging application (e.g., email or text messaging), a videoconferencing application, a social networking application, a map application, so-called productivity applications (e.g., word processors, spreadsheets), a graphics manipulation application, a media application, and so forth. In various implementations, software application 120 may rely on various types of mobile-centric hardware input to operate. For example, some applications may require use of a position coordinate sensor, an accelerometer, a microphone, a camera, and so forth. If software application 120 were installed locally on mobile device 102, these hardware inputs would be readily available to software application 120, e.g., via one or more device drivers. However, in the scenario of FIG. 1, software application 120 executes remotely from mobile device 102 on cloud-based streaming system 104.

Accordingly, in various implementations, one or more hardware components required for operation of software application 120 may be emulated, e.g., by virtual machine 118, so that they may provide virtual hardware input to software application 120. In FIG. 1, for instance, mobile device 102 includes a variety of hardware input components, such as cellular component 106, a touchscreen 122, a position coordinate component 124 (e.g., GPS, wireless triangulation, inertial measurement units or "IMU," etc.), a Wi-Fi component 126, a Bluetooth component 128, one or more cameras 130 (e.g., front-facing and rear-facing), an accelerometer 132, a microphone 134, and/or a battery 136. These are not meant to be exhaustive, and it should be understood that other hardware components may be available, depending on the configuration of mobile device 102. As is shown in FIG. 1, for each hardware input component of mobile device 102, a corresponding virtualized hardware component (e.g., 106', 122', 124', 126', 128' 130', 132', 134', and 136') is emulated by virtual machine 118.

As noted above, these virtualized hardware components may not necessarily be replicas of the corresponding hardware components of mobile device 102. In some implementations, generic versions of hardware components may be virtualized instead, e.g., when software application 120 is agnostic towards a particular model of hardware component that provides hardware input (e.g., the software application 120 may only require generic GPS input that would look similar no matter what specific hardware GPS component is implemented on mobile device 102). In other implementations, however, one or more virtualized hardware components emulated by virtual machine 118 may replicate, exactly or as closely as possible, a specific hardware component of mobile device 102. Thus, for instance, in some embodiments, streaming client 114 may provide VMM 116 and/or virtual machine 118 with a specific part number and/or manufacturer associated with a hardware component of mobile device 102, so that VMM and/or virtual machine 118 may mimic that specific hardware component as closely as possible. In some implementations, some virtualized hardware components may be replicas or near replicas of actual hardware components of mobile device 102, while other virtualized hardware components may be more generic.

It is not necessary that all hardware components of mobile device 102 be emulated by virtual machine 118. In some implementations, only those hardware components required by software application 120 may be emulated as virtualized hardware components. As noted above, in some implementations, mobile device 102 (e.g., by way of streaming client 114) may be configured to indicate to cloud-based streaming system 104 the particular hardware components included in the mobile device 102. This may indicate the hardware components for instance by providing the manufacturer and part number of each hardware component. This may allow virtual machine 118 to provide realistic emulation of hardware components of mobile device 102. Alternatively, the mobile device 102 may simply identify classes of hardware components (e.g. by indicating that there is a cellular component 106, a touchscreen 122, a position coordinate component 124, etc.). Virtual machine 118 may then emulate generic classes of the hardware components of the mobile device 102.

In some implementations, one or more virtualized hardware components emulated by virtual machine 118 may be configured to provide so-called "virtual hardware input" for software application 120. This virtual hardware input may be either "genuine" virtual hardware input or "simulated" virtual hardware input. "Genuine" virtual hardware input provided by a virtualized hardware component (e.g., 106', 122'-136') may be based on an actual hardware signal received from a hardware component (e.g., 106, 122-136) of mobile device 102 that corresponds to the virtualized hardware component. Suppose position coordinate sensor 124 provides an output (a position sensor hardware output) that indicates a measured position as data (e.g., ASCII), and may for instance be a stream of data compliant with a protocol such as NMEA 0183, TSIP, or TAIP. That position sensor hardware output may be provided, e.g., by streaming client 114, to VMM 116 and/or virtual machine 118. The GPS signal may then be available to a virtualized position coordinate sensor 124' emulated by virtual machine 118. Virtualized position coordinate sensor 124' may then generate genuine virtual hardware input that replicates (e.g., passes through) or at least is derived from the GPS signal originally provided by actual position coordinate sensor 124.

In contrast to genuine virtual hardware input, "simulated" virtual hardware input may be generated by a virtualized hardware component emulated by virtual machine 118, and may be generated independently of any hardware signal associated with an actual hardware component of mobile device 102 that corresponds to the virtual hardware input component. As noted above, there may be instances in which various hardware inputs of mobile device 102 are unavailable, either intentionally or simply because mobile device 102 is unable to provide them. Additionally or alternatively, there may be scenarios in which it may be desirable to simulate a hardware input even where an actual hardware input is available. Whichever the case, a virtualized hardware component (e.g., 106', 122'-136') may generate a simulated virtual hardware input, e.g., based on another hardware input, based on data provided by a user, based on user specification, randomly, and so forth.

Regardless of whether genuine or simulated virtual hardware input is provided to software application 120, so far as software application 120 is concerned, the virtual hardware input may appear to be nothing other than actual hardware input received from an actual hardware component. Software application 120 may then operate in a manner similar to that if it were installed locally on mobile device 102.

The selection between genuine and simulated virtual hardware input may be performed by various components in various implementations. In some implementations, virtual machine 118 itself may perform the selection. In other implementations, VMM 116 may perform the selection. In yet other implementations, streaming client 114 may perform the selection, and may instruct virtual machine 118 and/or VMM 116 to provide the selected genuine or simulated virtual hardware input. Such a selection may be based on a variety of signals.

In some implementations, selecting between genuine and simulate virtual hardware input may be selected based on one or more attributes of mobile phone 102. One example that is based on GPS hardware was described in the Summary above. Another attribute of mobile device 102 that may trigger and/or be used for selection between genuine and simulated virtual hardware input is a wireless signal of mobile device 102. Suppose mobile device 102 has a weak cellular signal, e.g., as indicated by data provided by cellular component 106. Suppose further that the application executed by virtual machine 118 requires at least some data that is obtained from or through cellular component 106. Most physical servers that would operate cloud-based virtual machines, such as the servers implementing cloud-based streaming service 104, may not typically include cellular components. Instead, such servers are usually connected to one or more other servers and/or networks using wired connections 112 such as Ethernet or T1.

In such a scenario, virtual machine 118 may emulate a virtualized cellular component 106' that provides at least some virtual hardware input (e.g., latency, ping, etc.) that would otherwise be provided by cellular component 106 installed on mobile device 102. However, instead of relying on cellular communication to obtain needed by software application 120, virtual machine 118 may "pipe" or otherwise route virtualized cellular card 106' to an actual wired connection (e.g., 112). Virtualized cellular card 106' may then obtain data for software application 120 executed by virtual machine 118 from wired connection 112, and may present the data to software application 120 as though the data arrive via cellular communication. As far as software application 120 is concerned, the data still comes from physical cellular component 106—it is unaware that the data is actually coming from wired connection 112 disguised as a cellular connection.

In some implementations, a user may also configure virtualized cellular component 106' to behave in a particular manner. For example, the user may wish to test how software application 120 operates when only a weak cellular signal is available. Even if the cellular signal between mobile device 102 and cloud-based streaming service 104 is strong (or if mobile device 102 is connected to cloud-based streaming service 104 using other means, such as Wi-Fi), the user may operate a user interface (examples depicted in FIGS. 3 and 4) to cause virtualized cellular component 106' to simulate a weak and/or erratic signal.

Another attribute of mobile device 112 that may trigger and/or be used as a basis for automatic selection between genuine and simulated virtual hardware input is battery power of mobile device 102 provided by battery 136. Suppose software application 120 requires hardware signals such as GPS, cellular signal, camera signal, etc. To obtain and provide these signals to one or more remote servers hosting cloud-based streaming service 104 may consume battery power of mobile device 102. Accordingly, in various implementations, virtual machine 118 (or VMM 116) may, on determining that the battery power of mobile device 102 is low, reduce or cease obtaining actual hardware signals associated with these components from mobile device 102. Instead, virtualized versions of these hardware components emulated by virtual machine 118 may generate virtual hardware inputs on behalf of these components. That way, software application 120 may use the virtual hardware signals provided by these virtualized hardware components, rather than requiring mobile device 102 to transmit actual hardware signals over one or more networks 110. The virtual hardware inputs generated by virtualized hardware components in such a low-battery-power scenario may be genuine or simulated. For example, in some implementations, virtual hardware signals may be selected randomly (and hence may be "simulated"). In other implementations, virtual hardware signals may be generated based on the last actual hardware signals received from hardware components of mobile device 102 (and hence may be "genuine").

Figure 2:
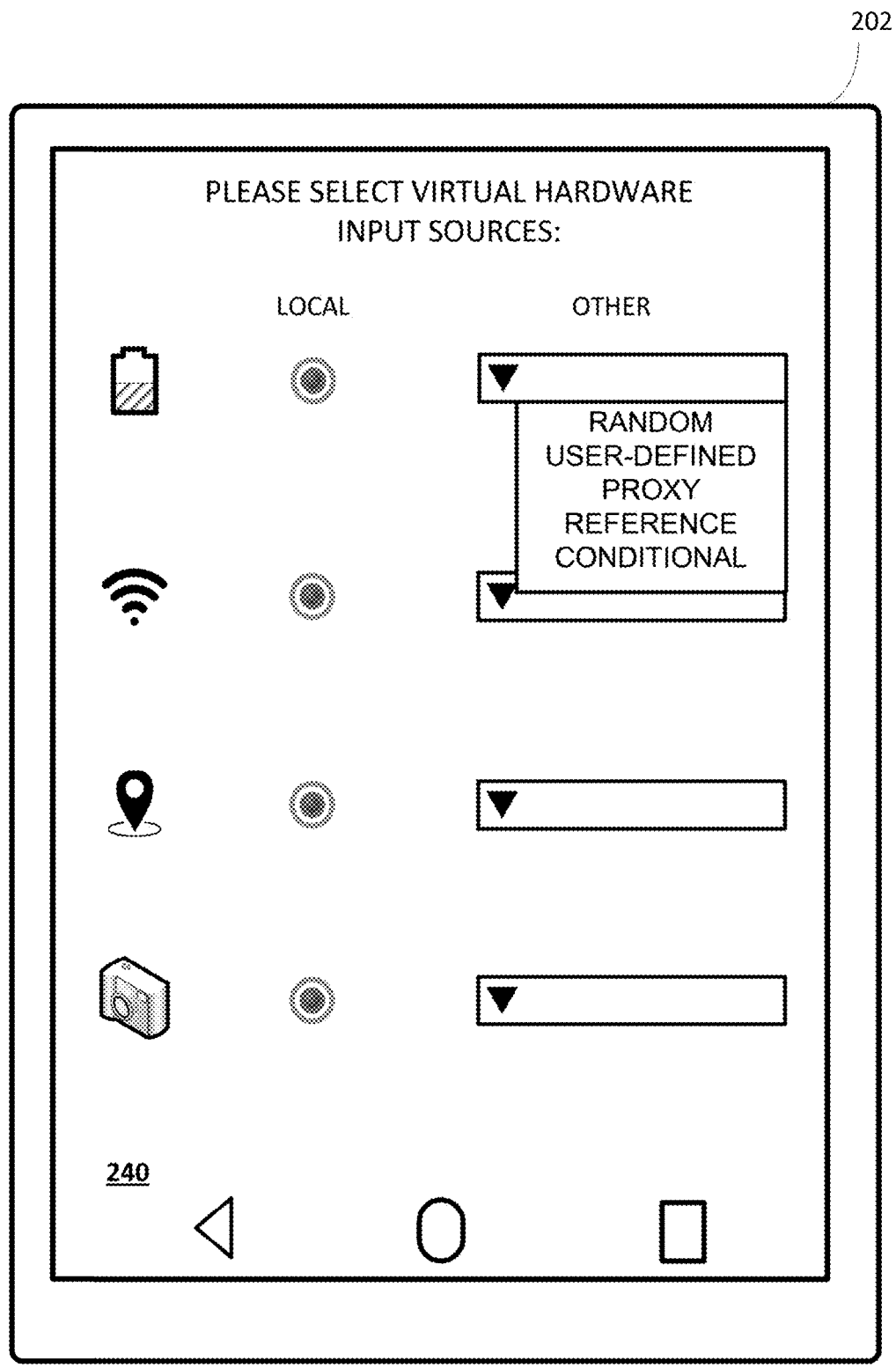
FIG. 2 and FIG. 3 each depict an example user interface that may be operated to configure emulation of genuine and/or simulated virtual hardware signals, in accordance with various implementations.

FIG. 2 depicts one non-limiting example of a user interface that may be rendered on a touchscreen display 240 of a mobile device 202 to manually select how various virtual hardware inputs will be generated at virtual machine 118, in accordance with various implementations. On the left are symbols that represent various hardware inputs, including (from top to bottom), battery, Wi-Fi, GPS, and camera. Other hardware inputs may be configured using an interface similar to that depicted in FIG. 2; the depicted hardware inputs are for illustrative purposes only.

The first option with each hardware input takes the form of a radio button. A user may select this button to cause virtual machine 118 to use local (or genuine) hardware input—that is, hardware input from the physical hardware component on mobile device 202—to generate virtual hardware input for use by software application 120. The second option on the right for each hardware component comprises a drop down menu with options that the user may select instead of the "local" option to cause virtual machine 118 to provide simulated virtual hardware input to software application 120. For example, the drop down menu associated with the battery is selected to show the following options: random; user-defined; proxy; reference; or conditional. These options are not meant to be limiting. One or more additional options may be presented, and/or one or more options may be omitted.

The "random" option may be selected by the user to cause virtual machine 118 to select a random value to be used as virtual hardware input for the associated hardware component. In the case of the battery, for instance, a value between 0% and 100% may be randomly selected, e.g., by VMM 116 and/or virtual machine 118. For Wi-Fi, selection of the "random" option may cause a random value between 0% and 100% signal strength to be selected. For GPS, selection of the "random" option may cause a random GPS coordinate (e.g., a random coordinate that satisfies one or more criteria imposed by software application 120) to be selected. For camera, selection of the "random" option may cause a random pre-existing photo or video to be used.

The "user-defined" option may be selected to allow a user to manually input a value to be used as the virtual hardware input, e.g., by VMM 116 and/or virtual machine 118. For example, for GPS, a user may indicate a GPS coordinate known to be associated with a geographic location that satisfies a criterion imposed by software application 120. For battery, a user may specify a battery power level that is selected to test how software application 120 will operate given with the indicated battery power level.

The "proxy" option may be selected to cause virtual machine 118 and/or VMM 116 to use a hardware input provided by another hardware component of mobile device 102/202 to generate virtual hardware input. For example, selection of the "proxy" option in association with GPS may allow the user to specify another hardware component, such as a cellular component (e.g., 106 in FIG. 1), as providing data that may be used to derive or otherwise generate a GPS coordinate. Cellular component 106 may provide, e.g., upon request, the identity and/or location of a radio tower (e.g., 108 in FIG. 1). The radio tower identity may be used, e.g., by virtual machine 118 and/or VMM 116, to generate an approximate geographic coordinate of mobile device 202 (e.g., the location of the radio tower itself, or a randomly-selected geographic location within wireless range of the radio tower).

The "reference" option may be selected to cause virtual machine 118 and/or VMM 116 to use a pre-defined data set to generate virtual hardware input. With GPS, for instance, a user could select the "reference" option and then specify a predefined route or path corresponding to a plurality of GPS coordinates obtained over some predetermined time interval that corresponds to a path travelled by another mobile device. For instance, a sequence of GPS coordinates may be recorded by a mobile device while travelling along a particular path, such as a common commuting route. This pre-recorded sequence of GPS coordinates may then be used as virtual hardware input to simulate mobile device 202 travelling along the same route. In some implementations, combinations of hardware inputs from multiple hardware components may be combined in a single reference data set. For example, a sequence of wireless signals (e.g., cellular or Wi-Fi) available to the mobile device along the above-described route may also be recorded and used in combination with the sequence of GPS coordinates to simulate both GPS coordinates and available wireless signal along the route.

As another example, the "reference" option may be selected in regard to the camera to cause VMM 116 and/or virtual machine 118 to provide a user-selected photo or video stream as simulated virtual hardware input for software application 120. Suppose a user wishes to test an app that receives as input a video feed and augments the video feed with various visual features, e.g., to alter the appearance of an individual depicted in the video feed in real time (e.g., a so-called "transform app"). If the user selects the "local" option for the camera, a video feed captured by camera 130 on mobile device 102 may be used by virtualized camera 130' to generate genuine camera virtualized hardware input. However, the user may wish to replace this video feed with a reference video feed of an individual that has minimal background features (e.g., a white wall) to adequately test the augmented reality features of the app. Accordingly, the user may select the "reference" option and be presented with an interface (not shown, e.g., a pop up window) that allows the user to select a pre-stored video file. This pre-stored video file may be provided as simulated virtual hardware input to software application 120. In some implementations, the user may be able to adjust various parameters of the camera virtual hardware input, such as camera resolution, preview image size, color properties, font versus rear-facing camera, and so forth.

Figure 3:
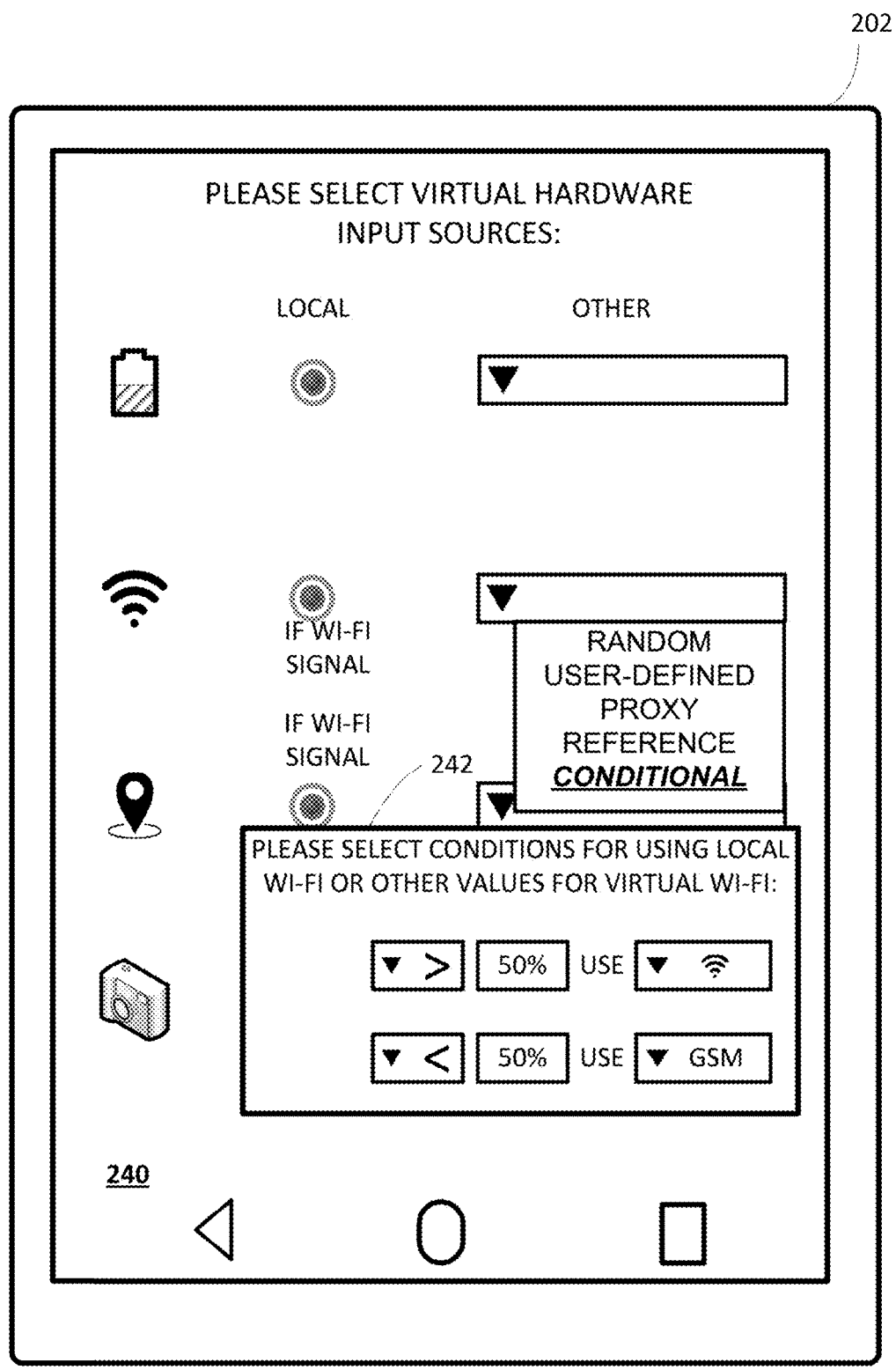

The "conditional" option may be selected by a user to cause VMM 116 and/or virtual machine 118 to generate genuine virtual hardware input under some circumstances, and to generate simulated virtual hardware input under other circumstances. FIG. 3 depicts on example of a pop up window 242 that may be presented when a user selects the "conditional" option from the Wi-Fi drop down menu. Pop up window 242 presents the user with a variety of selectable options for selecting when local Wi-Fi is used by VMM 116 and/or virtual machine 118 to generate genuine virtual hardware input, versus when simulated virtual hardware input is generated instead.

In this example, the settings indicate that when a Wi-Fi signal available to mobile device 102 is greater than 50% (e.g., signal strength), that Wi-Fi signal (or data indicative thereof) should be provided by mobile device 102 (e.g., via streaming client 114) to cloud-based streaming service 104. VMM 116 and/or virtual machine 118 may use that received Wi-Fi data to generate genuine Wi-Fi virtual hardware input for software application 120. However, if the Wi-Fi signal available to mobile device 102 is less than 50%, then VMM 116 and/or virtual machine 118 may generate simulated Wi-Fi virtual hardware input. In some implementations, mobile device 102 may provide an explicit command or notification to VMM 116/virtual machine 118 to simulate Wi-Fi virtual hardware input. In other implementations, mobile device 202 may simply refrain from sending any data indicative of its Wi-Fi connection to VMM 116/virtual machine 118. VMM 116/virtual machine 118 may interpret the lack of Wi-Fi signal provided by mobile device 202 to mean that VMM 116/virtual machine 118 should simulate Wi-Fi hardware input itself. In FIG. 3, the user has selected "GSM" (which is a cellular communication technique) as the hardware input to be used to generate the simulated virtual hardware input. Other options may include random, user-specified, reference, and so forth.

Figure 4:
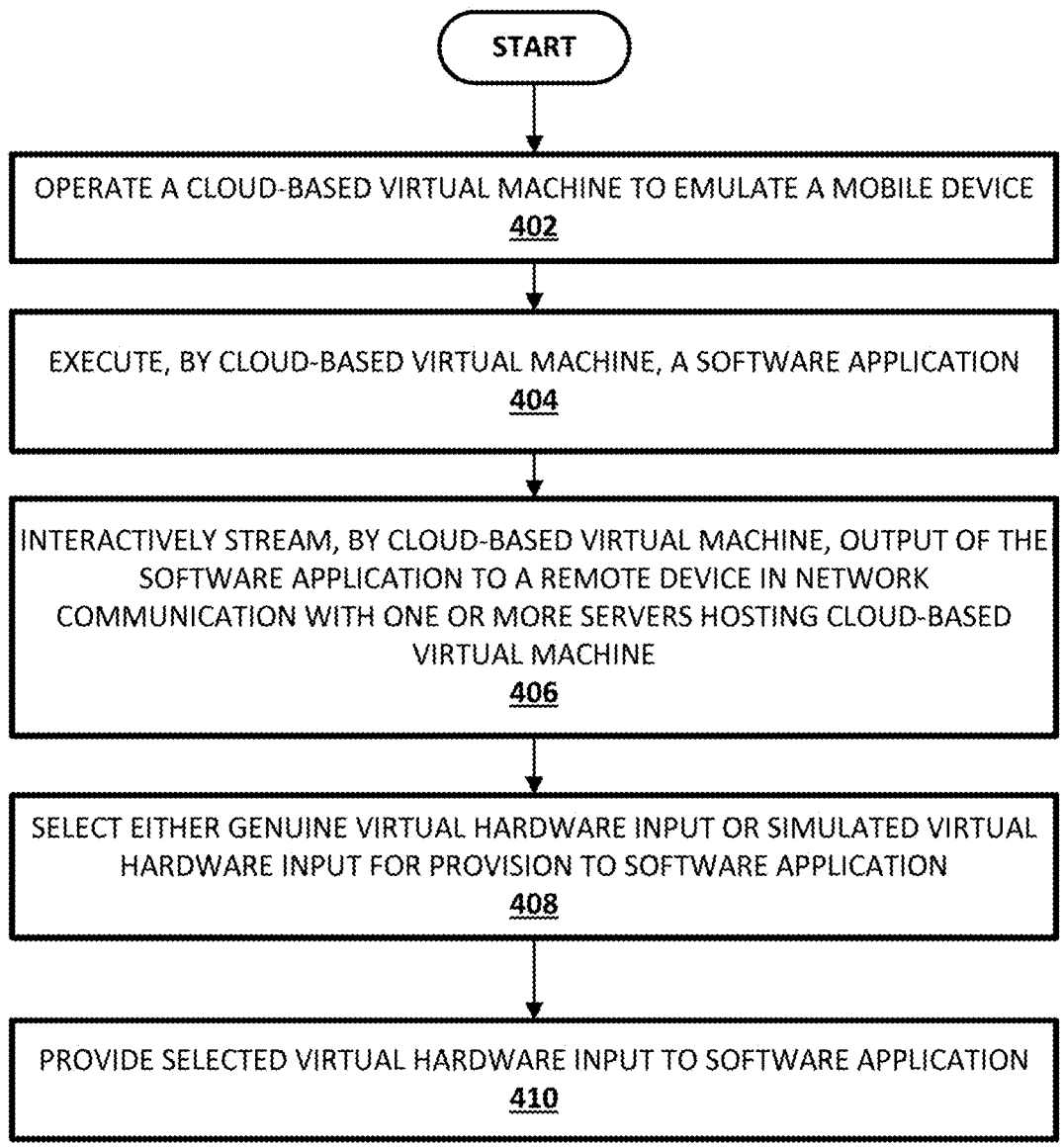
FIG. 4 depicts an example method for practicing disclosed techniques, in accordance with various implementations.

Referring now to FIG. 4, an example method 400 is depicted for emulating a virtualized hardware component that provides, as virtual hardware input for a software application executing on a cloud-based virtual machine, either "genuine" virtual hardware input or "simulated" virtual hardware input. For convenience, the operations of the flow chart are described with reference to a system that performs the operations. This system may include various components of various computer systems. For instance, some operations may be performed at the mobile device 102/202, while other operations may be performed by one or more components of cloud-based streaming system 104. Moreover, while operations of method 400 are shown in a particular order, this is not meant to be limiting. One or more operations may be reordered, omitted or added.

At block 402, the system may operate a cloud-based virtual machine (e.g., 118 in FIG. 1) to emulate a mobile device (e.g., 102 in FIG. 1, 202 in FIG. 2). In some implementations, the system may operate the cloud-based virtual machine on demand, e.g., when a user of mobile device 102/202 attempts to interact with (e.g., launches) a software application that is not installed locally but instead is streamed to the mobile device by cloud-based streaming system 104. The cloud-based virtual machine may be terminated or closed, for instance, when the user closes the streamed application. In other implementations, the system may operate the cloud-based virtual machine persistently across sessions in which the user interacts with the software application.

In some implementations, a separate cloud-based virtual machine may be operated for each streamed application a user interacts with using a single mobile device. In other implementations, a separate cloud-based virtual machine may be operated for each device operated by user (e.g., within an "ecosystem" of devices associated with the user) to interact with streamed applications. In such a scenario, a cloud-based virtual machine operated for a particular mobile device may or may not attempt to replicate, as closely as possible, a computing environment of the particular mobile device. In other implementations, the system may operate a virtual machine that is agnostic towards the "real" mobile device, and may instead provide a relatively generic environment. Using such a generic environment may increase the likelihood that more software applications will be compatible with the environment.

Referring back to FIG. 4, once the cloud-based virtual machine is operating, method 400 may proceed to block 404. At block 404, the system may cause the cloud-based virtual machine to execute a software application (e.g., 120 in FIG. 1). In some implementations, the cloud-based virtual machine may launch the software application at startup. In other implementations in which the cloud-based virtual machine is already running (e.g., persistent across user sessions), the cloud-based virtual machine may launch the software application in response to a user launching a corresponding streaming client (e.g., 114 in FIG. 1) on his or her mobile device.

At block 406, the system (e.g., cloud-based streaming service in FIG. 4) may interactively stream output of the software application to the user's mobile device across one or more computer networks, e.g., to be rendered by streaming client 114. As noted above, "interactively streaming" means that not only does the user see or otherwise perceive output of the software application on his or her mobile device, but the user may manipulate one or more hardware components of his or her mobile device (e.g., touch screen, microphone, accelerometer, etc.) to provide streaming input to the software application executed by the cloud-based virtual machine.

At block 408, the system may select, for provision to the software application, either genuine or simulated virtual hardware input. This selection may occur for one or more individual hardware components of the mobile device that may be required by a software application. A variety of signals may be used as a basis for the selection, such as one or more attributes of the mobile device (described above, battery power, wireless signal strength/availability/etc.). The signals may also include a comparison of an actual hardware signal to one or more criteria, which may or may not be imposed by the software application. For example, some software applications may not only require GPS input, but may require that coordinates provided by the GPS input satisfy certain criteria (e.g., within a certain region, outside of a certain region, etc.). If GPS coordinates provided by a position coordinate sensor of the mobile device do not satisfy these criteria, then the system may select simulated virtual hardware input to be used instead, such as a user-selected coordinate, or a randomly-selected coordinate that satisfies the criteria.

At block 410, the system may provide the selected virtual hardware input (genuine or simulated) to the software application. In some implementations, a virtualized hardware component (e.g., 106' or 122'-136' in FIG. 1) emulated by the cloud-based virtual machine may provide the virtual hardware input to the software application. As noted above, from the perspective of the software application executed by the cloud-based virtual machine, the virtual hardware input may appear to be actual hardware input provided by a local hardware component.

Figure 5:
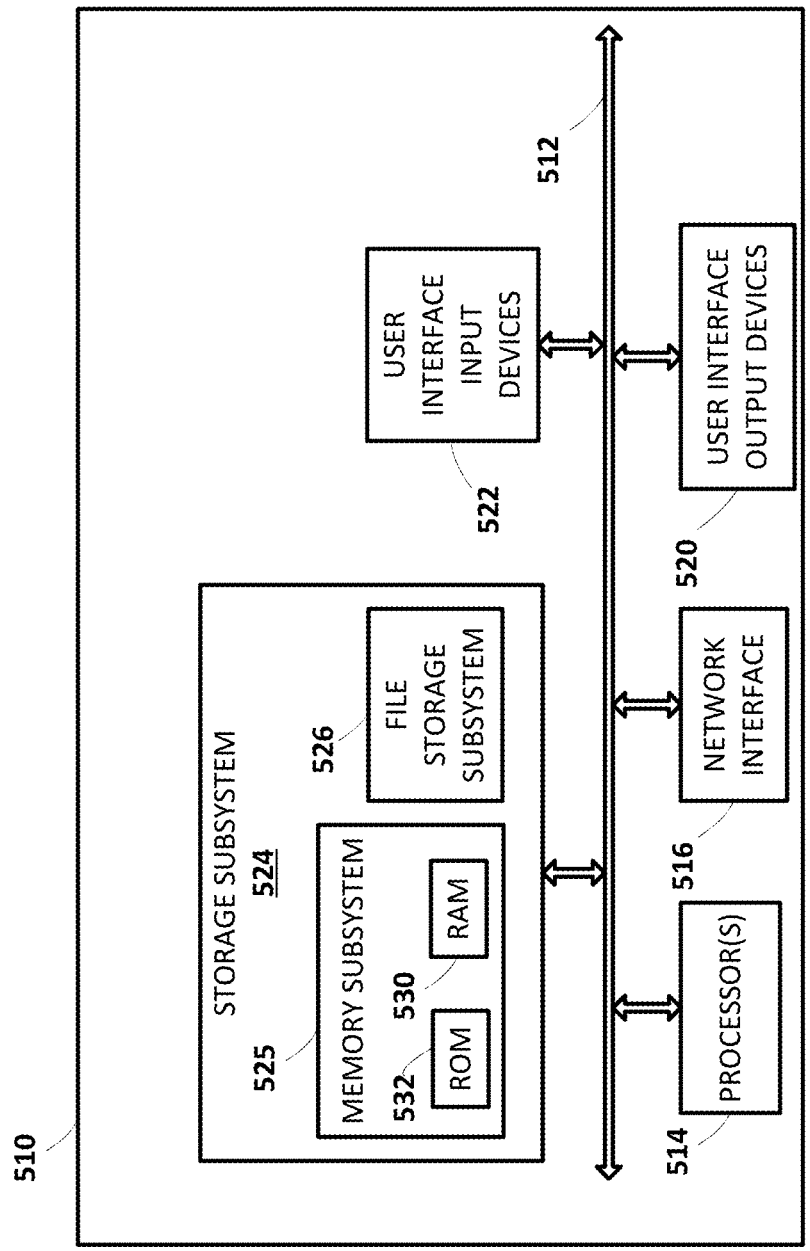
FIG. 5 illustrates an example architecture of a computer system.

FIG. 5 is a block diagram of an example computer system 510. Computer system 510 typically includes at least one processor 514 which communicates with a number of peripheral devices via bus subsystem 512. These peripheral devices may include a storage subsystem 524, including, for example, a memory subsystem 525 and a file storage subsystem 526, user interface output devices 520, user interface input devices 522, and a network interface subsystem 516. The input and output devices allow user interaction with computer system 510. Network interface subsystem 516 provides an interface to outside networks and is coupled to corresponding interface devices in other computer systems.

User interface input devices 522 may include a keyboard, pointing devices such as a mouse, trackball, touchpad, or graphics tablet, a scanner, a touchscreen incorporated into the display, audio input devices such as voice recognition systems, microphones, and/or other types of input devices. In general, use of the term "input device" is intended to include all possible types of devices and ways to input information into computer system 510 or onto a communication network.

User interface output devices 520 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 510 to the user or to another machine or computer system.

Storage subsystem 524 stores programming and data constructs that provide the functionality of some or all of the modules described herein. For example, the storage subsystem 524 may include the logic to perform selected aspects of method 400 and/or to implement one or more components of mobile device 102/202 and/or cloud-based streaming service 104.

These software modules are generally executed by processor 514 alone or in combination with other processors. Memory 525 used in the storage subsystem can include a number of memories including a main random access memory (RAM) 530 for storage of instructions and data during program execution and a read only memory (ROM) 532 in which fixed instructions are stored. A file storage subsystem 524 can provide persistent storage for program and data files, and may include a hard disk drive, a floppy disk drive along with associated removable media, a CD-ROM drive, an optical drive, or removable media cartridges. The modules implementing the functionality of certain implementations may be stored by file storage subsystem 524 in the storage subsystem 524, or in other machines accessible by the processor(s) 514.

Bus subsystem 512 provides a mechanism for letting the various components and subsystems of computer system 510 communicate with each other as intended. Although bus subsystem 512 is shown schematically as a single bus, alternative implementations of the bus subsystem may use multiple busses.

Computer system 510 can be of varying types including a workstation, server, computing cluster, blade server, server farm, or any other data processing system or computing device. Due to the ever-changing nature of computers and networks, the description of computer system 510 depicted in FIG. 5 is intended only as a specific example for purposes of illustrating some implementations. Many other configurations of computer system 510 are possible having more or fewer components than the computer system depicted in FIG. 5.

While several implementations have been described and illustrated herein, a variety of other means and/or structures for performing the function and/or obtaining the results and/or one or more of the advantages described herein may be utilized, and each of such variations and/or modifications is deemed to be within the scope of the implementations described herein. More generally, all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific implementations described herein. It is, therefore, to be understood that the foregoing implementations are presented by way of example only and that, within the scope of the appended claims and equivalents thereto, implementations may be practiced otherwise than as specifically described and claimed. Implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

What is claimed is:

1. A method implemented on a mobile device in network communication with a server operating a cloud-based game, the method comprising:
    monitoring a hardware signal raised by a local hardware component of the mobile device;
    based on the monitoring, determining that a resource available to the mobile device no longer satisfies a criterion;
    in response to the determining, causing the cloud-based game to transition from using a local hardware input of the mobile device with the cloud-based game to using another local hardware input of the mobile device as a proxy for the local hardware input, in lieu of the local hardware input, with the cloud-based game;
    receiving, from the server, an interactive stream generated by the cloud-based game; and
    transmitting, to the server, one or more signals generated based on user interaction with one or more of the local hardware components of the mobile device, wherein the one or more signals and the another local hardware input cause the cloud-based game to update the interactive stream.

2. The method of claim 1, wherein the causing is performed by the mobile device.

3. The method of claim 2, wherein the causing comprises transmitting a command to the server to use the another local hardware input.

4. The method of claim 2, wherein the causing comprises the mobile device refraining from sending data indicative of the local hardware input to the server.

5. The method of claim 1, wherein the determining that the resource available to the mobile device fails to satisfy the criterion includes a determination that battery power available to the mobile device falls below a minimum threshold.

6. The method of claim 1, wherein the determining that the resource available to the mobile device fails to satisfy the criterion includes a determination that a wireless signal strength available to the mobile device falls below a minimum threshold.

7. A mobile device in network communication with a server operating a cloud-based game, the mobile device comprising one or more processors and memory storing instructions that, in response to execution of the instructions by the one or more processors, cause the one or more processors to:
  monitor a hardware signal raised by a local hardware component of the mobile device;
  based on the hardware signal raised by the local hardware component, determine that a resource available to the mobile device no longer satisfies a criterion;
  in response to the determination, cause the cloud-based game to transition from using a local hardware input of the mobile device with the cloud-based game to using, in lieu of the local hardware input, another local hardware input of the mobile device as a proxy for the local hardware input or simulated virtual hardware input with the cloud-based game;
  receive, from the server, an interactive stream generated by the cloud-based game; and
  transmit, to the server, one or more signals generated based on user interaction with one or more of the local hardware components of the mobile device, wherein the one or more signals and the simulated hardware input cause the cloud-based game to update the interactive stream.

8. The mobile device of claim 7, wherein the memory stores instructions to transmit a command to the server to use the another local hardware input or the simulated virtual hardware input.

9. The mobile device of claim 7, wherein the memory stores instructions to transmit a command to the server to simulate the virtual hardware input.

10. The mobile device of claim 7, wherein the memory stores instructions to cause the mobile device to refrain from sending data indicative of the local hardware input to the server.

11. The mobile device of claim 7, wherein the determination that the resource available to the mobile device fails to satisfy the criterion includes a determination that battery power available to the mobile device falls below a minimum threshold.

12. The mobile device of claim 7, wherein the determination that the resource available to the mobile device fails to satisfy the criterion includes a determination that a wireless signal strength available to the mobile device falls below a minimum threshold.

13. A method implemented on a mobile device in network communication with a server operating a cloud-based game, the method comprising:
  monitoring a hardware signal raised by a local hardware component of the mobile device;
  based on the monitoring, determining that an amount of a resource used by the mobile device has fallen below a non-zero threshold;
  in response to the determining, causing the cloud-based game to transition from using a local hardware input of the mobile device with the cloud-based game to using simulated virtual hardware input, in lieu of the local hardware input, with the cloud-based game;
  receiving, from the server, an interactive stream generated by the cloud-based game; and
  transmitting, to the server, one or more signals generated based on user interaction with one or more of the local hardware components of the mobile device, wherein the one or more signals and the simulated hardware input cause the cloud-based game to update the interactive stream.

14. The method of claim 13, wherein the resource comprises battery power available to the mobile device.

15. The method of claim 13, wherein the amount of the resource comprises a strength of a wireless signal.

* * * * *